US006460246B2

(12) United States Patent
Ullrich et al.

(10) Patent No.: US 6,460,246 B2
(45) Date of Patent: Oct. 8, 2002

(54) METHOD FOR CONNECTING CONTACT SURFACES OF ELECTRICAL COMPONENT BLANKS AND DEVICE THEREFOR

(75) Inventors: Karlheinz Ullrich, Gross-Umstadt (DE); Karl-Heinz Wienand, Aschaffenburg (DE); Armin Lotz, Gelnhausen (DE)

(73) Assignee: Heraeus Electro-Nite International N.V., Houthalen (BE)

(*) Notice: Subject to any disclaimer, the term of this patent is extended or adjusted under 35 U.S.C. 154(b) by 99 days.

(21) Appl. No.: 09/779,035

(22) Filed: Feb. 7, 2001

Prior Publication Data

US 2001/0020327 A1 Sep. 13, 2001

(30) Foreign Application Priority Data

Feb. 7, 2000 (DE) ........................................ 100 05 095

(51) Int. Cl.[7] ................................................ H05K 3/00

(52) U.S. Cl. .......................................... 29/844; 29/863

(58) Field of Search .......................... 29/843, 844, 846, 29/825, 854, 831, 874, 34 R, 33 M

(56) References Cited

U.S. PATENT DOCUMENTS 5,688,150 A * 11/1997 Seidler et al. .............. 439/876

FOREIGN PATENT DOCUMENTS

DE G 89 13 803.1 4/1990

* cited by examiner

*Primary Examiner*—Edward K. Look
*Assistant Examiner*—Dwayne J. White
(74) *Attorney, Agent, or Firm*—Akin, Gump, Strauss, Hauer & Feld, L.L.P.

(57) ABSTRACT

In order to connect contact surfaces of electric component blanks for layer resistors to at least two elongated, metallic connection leads, elongated, slot-shaped openings are made, e.g., by etching, in a continuous metal sheet to manufacture a connection lead blank. The openings border on later connection leads of the connection blank and cross-struts yet to be removed. In a second step, the connection lead blank is brought into a cassette and seized, whereby one of the cross-struts projects out of the cassette and is separated in a third step, such that the free ends of the parallel-running connection leads project out of the cassette. In a fourth step, the cassette is brought into a bonding or welding device, so that the free ends of the connection leads cover the contact surfaces of a component blank or a multi-component blank and are connected together by a bonding or welding operation. In case a multi-component blank (multi-unit plate) is used, it is then separated into individual components. Proving to be advantageous are a high corrosion resistance (up to 750° C.) and the possibility of largely automated manufacturing and further processing.

14 Claims, 4 Drawing Sheets

METHOD FOR CONNECTING CONTACT SURFACES OF ELECTRICAL COMPONENT BLANKS AND DEVICE THEREFOR

BACKGROUND OF THE INVENTION

The invention relates to a method for connecting contact surfaces of electrical component blanks, in particular contact surfaces on substrates having an electrically insulating surface and a layer resistor located thereon, with at least two extended, metallic connecting leads of a connection lead blank, which are first connected mechanically to each other by at least two cross-struts arranged spaced from each other in the connection lead blank. The invention also relates to a device for carrying out the method.

As component blanks, both single type semi-finished component products as well as continuous multiple type semi-finished component products are identified, which are separated into discrete components after their connection with connection leads. The latter are also designated as multi-component blanks (i.e., multi-unit plates).

From German Utility Model G 89 13 803.1 U1, a resistance thermometer is known for measuring surface temperature using a metal film temperature sensor, which is arranged in a plastic housing of an electronic power component with a cooling surface. The connection, which is constructed as a cooling unit of the electronic component and provided with a bore, forms the carrier or support for the metal film temperature sensor, wherein the connection surfaces of the metal layer temperature sensor are connected by bonding wires with the connections provided for the electronic power element. The housing is bounded by the metal surface of the connection used as a support and the plastic sheath, which surrounds the metal layer temperature sensor and the contact points of the bonding wires with the outwardly-guided connections. The bonding wires located between the connection surfaces of the sensor and the contact points of the connections are preferably made of gold, silver, platinum, or aluminum, and are preferably connected in an electrically conducting manner by thermo-compression bonding with connection surfaces and contact points. The relatively complicated manufacturing technology for the connection using bonding wires has proven to be problematic, since here, in addition to the adhesion of the sensor element to a connection, the additional contacting between connection surfaces and contact points is necessary. Furthermore, the temperature stability at higher temperatures is considered to be problematic.

BRIEF SUMMARY OF THE INVENTION

An object of the invention is to make available in a cost-effective manner connection wires or bands on bonding pads, which produce an electrically and mechanically firm connection to the sensor element, wherein a corrosion resistance up to 750° C. is provided.

This object is achieved according to the method in that in a first step for manufacturing a connection lead blank, openings are made in continuous metal sheet, which border the later cross-struts and connection leads of the connection lead blank. In a second step, the connection lead blank is brought into a cassette and seized there, such that one of the cross-struts projects out of the cassette (or cassette mouth) and is separated in a third step, in such a way that free ends of parallel-running connection leads project out of the cassette (or cassette mouth). In a fourth step, the cassette is brought into a bonding or welding device, so that the free ends of the connection leads are brought to cover the respective connection surfaces of at least one component blank or multi-component blank, and are connected to each other by a temperature-assisted bonding operation or by welding.

It has proven to be advantageous that, according to the method of the invention, sensor elements (or their contact surfaces) can be provided both as single units and as multi-component blanks with corresponding connection leads, wherein a largely automated manufacturing and further processing is possible.

In a preferred embodiment of the method, elongated, slot-shaped openings for the connection lead blank are etched from the metal sheet in the first step. In another embodiment of the method, elongated, slot-shaped openings for the connection lead blank are punched from the metal sheet in the first step. Furthermore, it is advantageously also possible to cut the elongated, slot-shaped openings for the connection lead blank from the metal sheet using a laser beam or a high pressure water jet, or a combination thereof.

Preferably, in the first step, openings for seizing the connection lead blank in the cassette and targeted breaking points for further processing are formed simultaneously.

In a preferred embodiment of the method, in the third step, the cross-strut is separated by mechanical stressing of the targeted breaking points or targeted breaking lines in the connection lead blank.

In the fourth step of the method, the free ends of the connection lead blank are advantageously brought together to cover the contact surfaces of a single type blank or of a multi-unit blank provided with targeted breaking points for separating blanks and are then bonded or welded, wherein the multi-unit blank is subsequently separated into individual blanks. Here, the free ends of the connection lead are advantageously connected together with the contact surfaces or bonding pads of the components by thermo-compression bonding or welding. At the conclusion of the fourth step, the second cross-strut is separated from the connection lead blank so that individual components result.

The method according to the invention has proven to be especially advantageous in regard to an automated processing or subsequent processing for large piece counts. In particular, a considerable cost-efficiency is to be achieved the manufacture and joining of band-shaped connection leads for multi-component blanks (parallel production in multi-units), since a connection lead blank is joined as a so-called "multi-band etching part" or "leadframe" to a complete series of individual component blanks or to a multi-component blank.

The object of the invention is achieved by a device in that, for receiving the connection lead blank manufactured according to the first step, a cassette having a lower part and an upper part is provided with a planar bearing surface for the connection lead blank, wherein bumps and/or pins project at least from the plane of the bearing surface for the purpose of orienting the connection lead blank by means of the openings located therein for the purpose of seizing it, wherein for the form-fit seizing of the cassette upper part, recesses are provided corresponding to the bumps.

It has proven to be especially advantageous that using the device, an exact positioning and dimensioning is possible by striking elements and beveled elements. In this manner, an inexact positioning of the connection lead blank is prevented.

In a preferred embodiment of the device, a separation device has a receiving device for the cassette, for the purpose of defined separation of a first cross-strut projecting from a first end of the cassette. A separation stamp is provided as a bending-aid, whose movement path cuts the planar bearing surface at an angle of 85 to 95°. Advantageously, the plane of the movement path of the separation stamp cuts the connection lead blank in the region of a targeted breaking point (or targeted breaking line).

Furthermore, in a preferred embodiment for performing the fourth step, the device has a bonding device or welding device with an assembly for form-fit reception of the cassette, wherein the cassette can be inserted with its first end adjacent to a heating plate, and the heating plate has a bearing surface for component blanks or a multi-component blank.

As a material for the connection lead, nickel or a nickel-based alloy is preferably used. Furthermore, it is possible to use stainless steel and silver or a silver-based alloy for the connection lead. The thickness of the connection lead blank lies in the range of about 0.05 to 0.6 mm, preferably about 0.15 to 0.25 mm.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiment(s) which are presently preferred. It should be understood, however, that the invention is not limited to the precise arrangements and instrumentalities shown. In the drawings.

DETAILED DESCRIPTION OF THE INVENTION

Figure 1A:
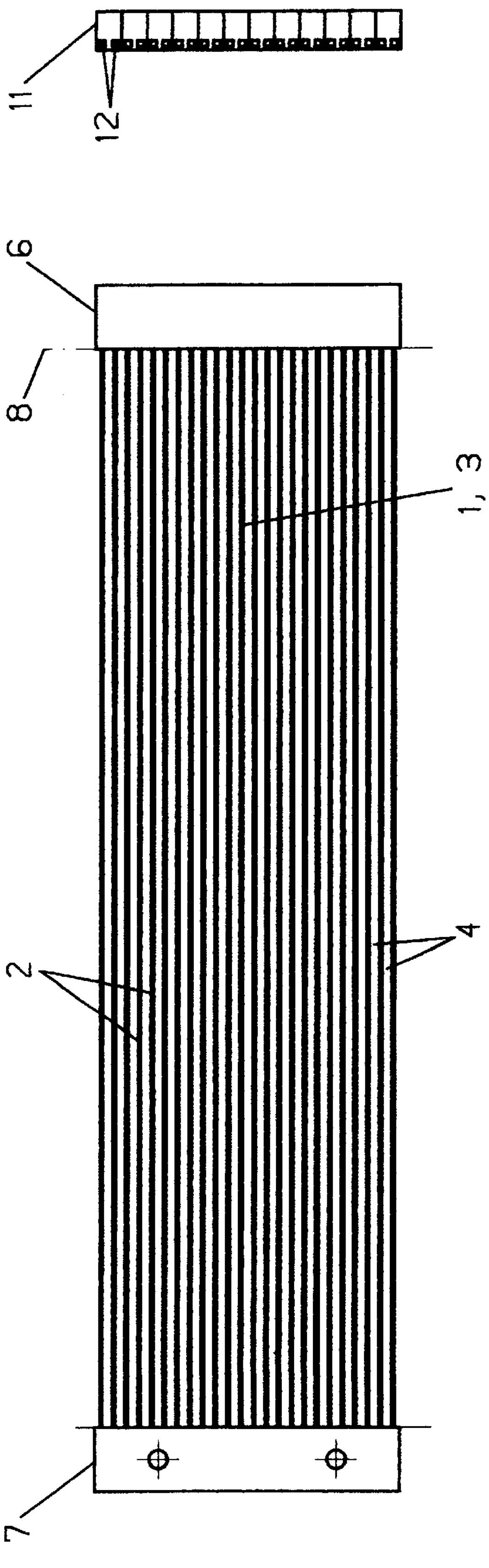
FIG. 1*a* is a plan view of a connection lead blank (on the left) together with a component blank (on the right)

According to FIG. 1*a*, the connection lead blank 1 has a plurality of elongated, metallic connection leads 2, which are formed by etching, punching or cutting from a metal sheet 3, wherein elongated, slot-shaped openings 4 can be recognized. The connection leads 2 are connected to each other by a first cross-strut 6 and a second cross-strut 7, respectively. Perpendicular to the axis of the elongated connection leads 2 runs a targeted breaking line 8, along which the first cross-strut 6 is separated from the individual connection leads 2 of the connection lead blank 1, in such a way that free ends 9 of the connection lead 2 are presented, as shown in the following by FIG. 4.

Furthermore, a multi-component blank 11 is recognizable in FIG. 1*a*, whose contact pads 12 of which have the same spacing from each other as the connection leads 2 of the connection lead blank.

Figure 1B:
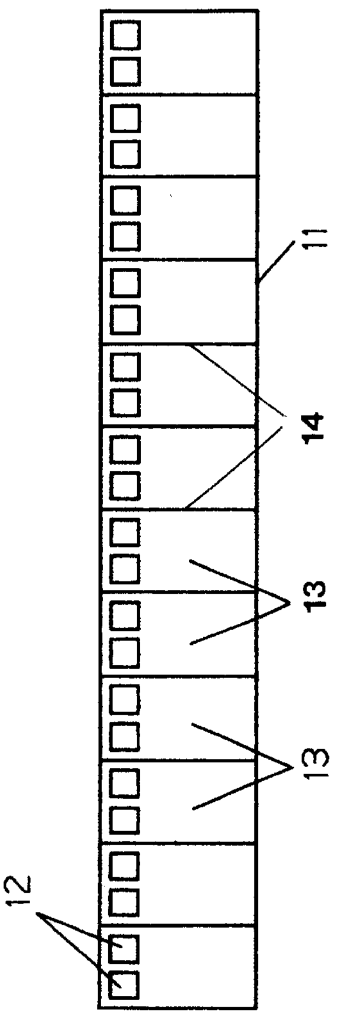
FIG. 1*b* is an enlarged plan view of the component blank shown on the right in FIG. 1.

In FIG. 1*b* the multi-component blank 11 is shown enlarged, so that its substrate 13, the contact pads 12 and the target breaking points 14 can be clearly recognized.

Figure 2A:
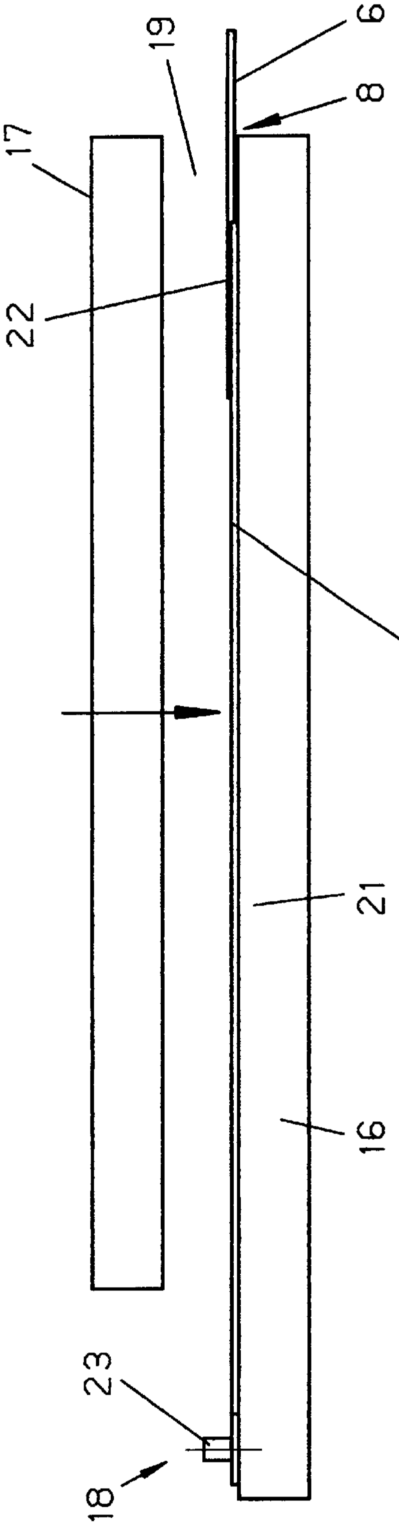
FIG. 2*a* is a side view of a cassette with upper and lower parts, including a connection lead blank.

The connection lead-blank 1 is stretched, according to FIG. 2*a*, in a cassette 18 comprising a lower part 16 and an upper part 17, in such a way that the first cross-strut 6 and the targeted breaking line 8 project out of a mouth 19 of the cassette.

Figure 2B:
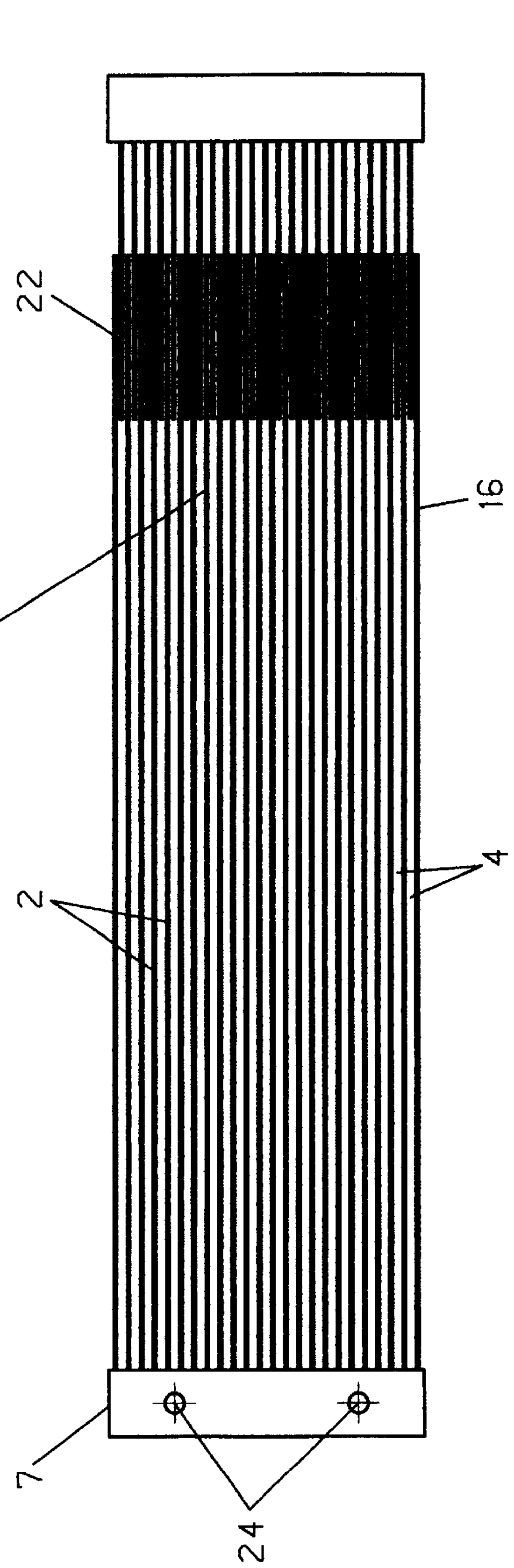
FIG. 2*b* is a plan view of a connection lead blank held on the lower part of the cassette with bumps for seizing the connection lead blank.

FIG. 2*b* shows in a plan view the cassette lower part 16 with a largely planar bearing surface 21 having bumps 22 and pins 23 for seizing the connection lead blank 1 to be brought in. FIG. 2*b* also shows the blank itself mounted in the cassette.

According to FIG. 2*b*, the connection lead blank 1 contacts, by its connection leads 2, a series of bumps 22 of the lower part 16 of the cassette, wherein the bumps 22 extend through the elongated, slot-shaped openings 4 of the blank. In this manner, a seizing of the connection lead blank 1 ensures against lateral shifting. Furthermore, the second cross-strut 7 has at least two openings 24, in which the pins 23 (affixed to the lower part 16 of the cassette according to FIG. 2*a*) engage. In this manner, the connection lead blank 1 is protected against longitudinal shifting and against lateral rotation.

Figure 3A:
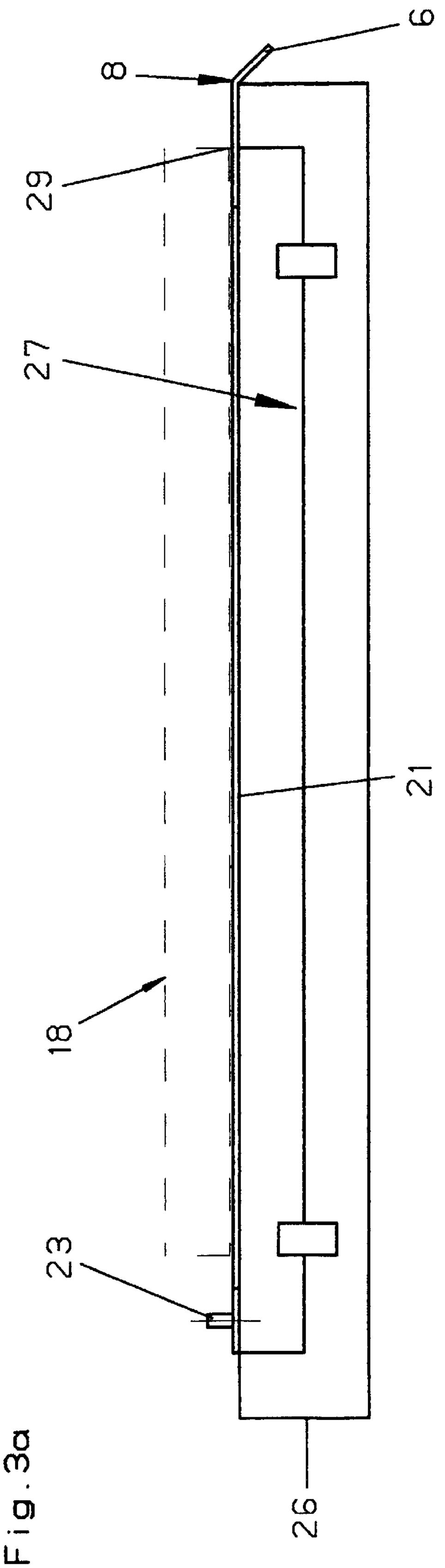
FIG. 3*a* is a side view of a separation device with a receptacle for the cassette, which is loaded with the connection lead blank for the purpose of separating a cross-strut, wherein by separation free ends of individual connection leads projecting from the cassette mouth are formed.
Figure 3B:
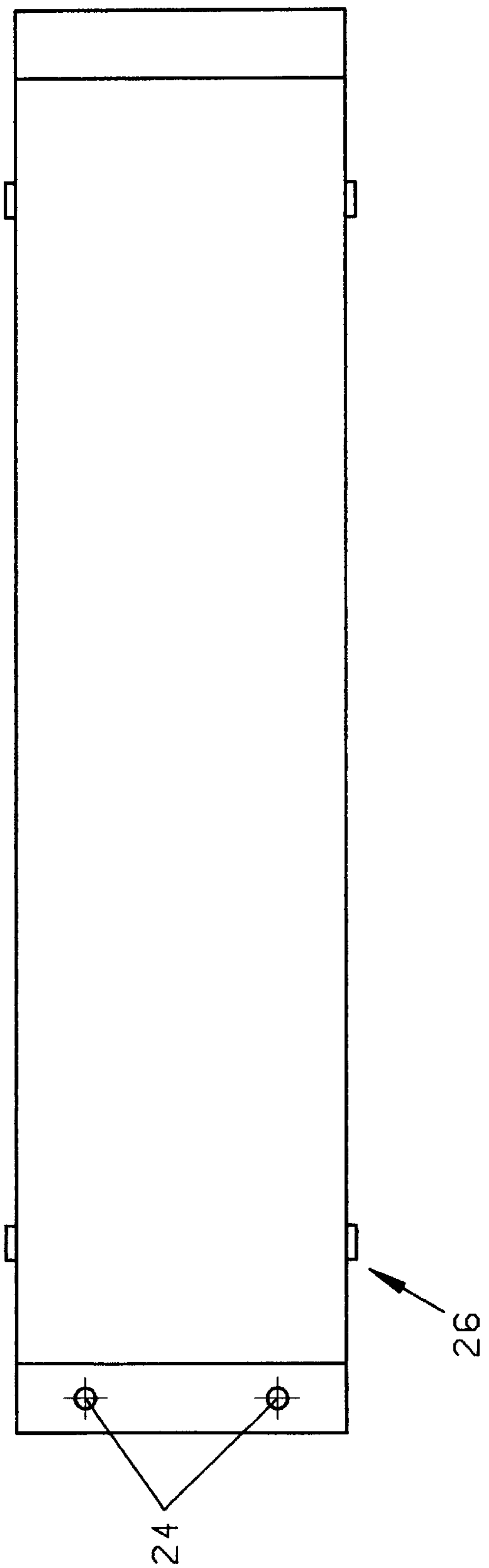
FIG. 3*b* is a plan view showing the cassette is held in a form-fit manner in a recess of the separation device with lateral support elements.

The actual separation device 26 with the receptacle 27 for the cassette 18 is explained in greater detail using FIGS. 3*a* and 3*b*. According to FIG. 2*a*, the targeted breaking point 8 of the connection lead blank 1 lies outside a first end 29 of the cassette mouth 19 or projects out of the cassette mouth 19. The bending of the first cross-strut 6 at the breaking line 8 (shown in FIG. 3*a*) is done in such a way that the free ends 9 of the connection leads project slightly out of the cassette 18 (see FIG. 4) after the bending operation.

Figure 4:
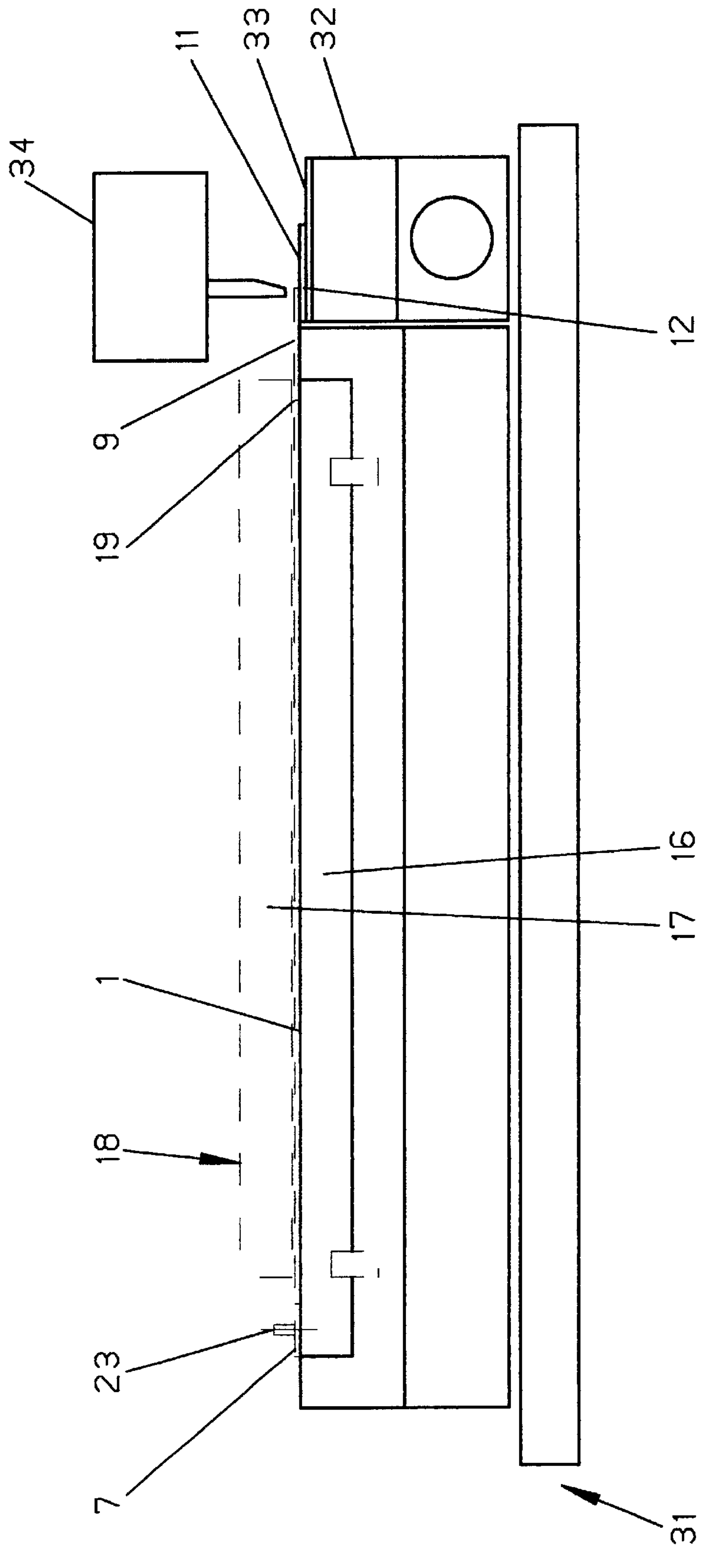
FIG. 4 is a side view of a bonding device with the cassette and connection lead blank held therein.

According to FIG. 4, the cassette 18 with the connection lead blank 1 is inserted into a recess of the bonding or welding device 31 after the bending operation. Here, the free ends 9 projecting out of the cassette mouth 19 are positioned on the contact pads 12 of component blanks or multi-component blanks 11 (according to FIG. 1*a*, 1*b*), in such a way that the free ends 9 cover the respective contact pads 12. The component blanks or multicomponent blanks 11 are positioned here on a bearing surface 33 of a heating plate 32 of the bonding or welding device 31, whereby it is possible to connect the free ends 9 of the connection lead blank 1 electrically and mechanically fixed with the contact pads 12 by using a lowerable bonding or welding head 34 in a thermo-compression bonding or welding operation. After the bonding or welding operation, the component blank or multi-component blank 11 is thereby connected at one end to the connection lead blank 1, which is held together at its other end by the second cross-strut 7 with its connection leads 2.

Subsequently, in another method step, the dividing up into individual elements occurs, in which in case of a multi-component blank 11, these are separated at their targeted breaking points 14 running parallel along the axes of the connection leads 2 (FIG. 1*b*). The cross-strut 7 is separated from the connection lead blank 1 by a further bending operation or cutting operation, so that individual component blanks are presented, which are each then connected with two or even more connection leads 2.

It will be appreciated by those skilled in the art that changes could be made to the embodiments described above without departing from the broad inventive concept thereof.

It is understood, therefore, that this invention is not limited to the particular embodiments disclosed, but it is intended to cover modifications within the spirit and scope of the present invention as defined by the appended claims.

We claim:

1. A method for connecting contact surfaces of electrical component blanks, in particular contact surfaces on substrates with an electrically insulating surface and a layer resistor located thereon, with at least two elongated, metallic, connecting leads of a connection lead blank, the connecting leads first being connected mechanically to each other by at least two cross-struts spaced from each other in the connection lead blank, the method comprising in a first step for manufacturing a connection lead blank forming openings in a continuous metal sheet, the openings bordering on the later-formed cross-struts and connection leads of the connection lead blank, in a second step, bringing the connection lead blank into a cassette and seizing it there in a manner such that one of the cross-strut projects out of the cassette, in a third step separating the one cross-strut from the connection leads such that free ends of the connection leads project out of the cassette running parallel to each other, and in a fourth step bringing the cassette into a bonding or welding device so that the free ends of the connection leads are brought to cover respective connection surfaces of at least one component blank or multi-component blank, and connecting the free ends and connection surfaces to each other by a bonding operation or by welding.

2. The method according to claim 1, wherein in the first step the openings are formed by etching elongated, slot-shaped openings for the connection lead blank from the metal sheet.

3. The method according to claim 1, wherein in the first step the openings are formed by punching elongated, slot-shaped openings for the connection lead blank from the metal sheet.

4. The method according to claim 1, wherein in the first step the openings are formed by cutting elongated, slot-shaped openings for the connection lead blank from the metal sheet using a laser beam.

5. The method according to claim 1, wherein in the first step the openings are formed by cutting elongated, slot-shaped openings for the connection lead blank from the metal sheet using a high-pressure water jet.

6. The method according to claim 1, wherein after the fourth step the second cross-strut is separated from the connection lead blank.

7. The method according to claim 1, wherein in the first step the openings in the connection lead blank and targeted breaking points for further processing are formed simultaneously.

8. The method according to claim 7, wherein in the third step the cross-strut is separated by mechanical stressing of the targeted breaking points in the connection lead blank.

9. The method according to claim 1, wherein in the fourth step the free ends of the connection leads are brought together to cover the contact surfaces of a multi-component blank provided with targeted breaking points for separating the blanks, the free ends and the contact surfaces are then bonded or welded together, and subsequently the multi-component blank is separated into separate blanks.

10. The method according to claim 9, wherein in the fourth step the free ends of the connection leads are bonded together with the contact surfaces of the components by thermo-compression bonding or welding.

11. A device for performing the method of claim 1, comprising a cassette for receiving the connection lead blank (1) manufactured according to the first step, the cassette (18) having a lower part (16), an upper part (17) and a planar bearing surface (21) for receiving the connection lead blank (1), wherein bumps (22) and/or pins (23) project at least out the planar bearing surface (21) to orient and seize the connection lead blank (1) using the openings (24) located therein, and the upper part (17) of the cassette having recesses therein which match the bumps in order to seize the connection lead blank (1) in a form-fit manner.

12. The device according to claim 11, further comprising a bonding device or welding device (31) with an assembly for form-fit receiving of the cassette (18) to perform the fourth step, wherein the cassette (18) is inserted with its first end (29) adjacent to a heating plate (32), and the heating plate has a bearing surface (33) for component blanks or a multi-component blank (11).

13. The device according to claim 11, further comprising a separation device (26) having a receiving device (27) for the cassette (18) for defined separation of a first cross-strut (6) projecting from a first end (29) of the cassette (18) and a separation stamp to assist bending of the first cross-strut, wherein a movement path of the separation stamp cuts the planar bearing surface at an angle of 85 to 95°.

14. The device according to claim 13, wherein a plane of the movement path of the separation stamp cuts the connection lead blank (1) in a region of a targeted breaking lead (8).

* * * * *